United States Patent
Lim et al.

(10) Patent No.: US 11,997,929 B2
(45) Date of Patent: May 28, 2024

(54) THERMOELECTRIC MATERIAL AND PREPARATION METHOD THEREFOR

(71) Applicant: LG ELECTRONICS INC., Seoul (KR)

(72) Inventors: Jongrae Lim, Seoul (KR); Jun Kim, Seoul (KR); Jooyoung Park, Seoul (KR); Jeonghun Son, Seoul (KR); Youngil Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/422,321

(22) PCT Filed: Jun. 11, 2019

(86) PCT No.: PCT/KR2019/006967
§ 371 (c)(1),
(2) Date: Jul. 12, 2021

(87) PCT Pub. No.: WO2020/149464
PCT Pub. Date: Jul. 23, 2020

(65) Prior Publication Data
US 2022/0102607 A1    Mar. 31, 2022

Related U.S. Application Data

(60) Provisional application No. 62/793,898, filed on Jan. 18, 2019.

(51) Int. Cl.
*H10N 10/852*  (2023.01)
*H10N 10/01*  (2023.01)
(Continued)

(52) U.S. Cl.
CPC ........... *H10N 10/852* (2023.02); *H10N 10/01* (2023.02); *H10N 10/853* (2023.02); *H10N 10/857* (2023.02)

(58) Field of Classification Search
CPC ......... H01L 35/16; H01L 35/18; H01L 35/34; H01L 35/26; H10N 10/852; H10N 10/853; H10N 10/01; H10N 10/857
See application file for complete search history.

(56) References Cited

U.S. PATENT DOCUMENTS 3,258,427 A * 6/1966 Rupprecht .............. H01L 35/16
                                                                    136/238
5,108,515 A * 4/1992 Ohta ....................... H01L 35/18
                                                                    136/238
(Continued)

FOREIGN PATENT DOCUMENTS

KR    10-2013-0006039 A    1/2013
KR    10-2016-0122468 A    10/2016
(Continued)

OTHER PUBLICATIONS

WO 2008028852 A2, Machine Translation (Year: 2008).*
(Continued)

*Primary Examiner* — Devina Pillay
(74) *Attorney, Agent, or Firm* — Birch, Stewart, Kolasch & Birch, LLP

(57) ABSTRACT

The present invention relates to a thermoelectric material and, specifically, to a thermoelectric material capable of improving the figure of merit and a preparation method therefor. In the present invention, the thermoelectric material may comprise: a matrix compound having a composition of chemical formula 1 or 2; and particles having a composition of chemical formula 3 dispersed in the matrix compound. $(AB_2)_x(Bi_2Se_{2.7}Te_{0.3})_{1-x}$, $(CB)_x(Bi_2Se_{2.7}Te_{0.3})_{1-x}$, $D_yE_z$.

8 Claims, 11 Drawing Sheets

(51) Int. Cl.
    *H10N 10/853*    (2023.01)
    *H10N 10/857*    (2023.01)

(56) References Cited

U.S. PATENT DOCUMENTS

2011/0248210 A1* 10/2011 Willigan ............... C04B 35/653
                                                                              252/502
2018/0083176 A1* 3/2018 Ryu ........................ H01L 35/18

FOREIGN PATENT DOCUMENTS

| KR | 10-2015916 B1 | 8/2019 | | |
|----|---------------|--------|---|---|
| WO | WO-2008028852 A2 | * | 3/2008 | ........... C01B 19/007 |
| WO | WO-2016167525 A1 | * | 10/2016 | ............ H01L 35/16 |

OTHER PUBLICATIONS

Wu, High thermoelectric performance in Cu-doped Bi2Te3 with carrier-type transition, vol. 157, Sep. 15, 2018, pp. 33-41 (Year: 2018).*

Li et al., "Significantly enhanced figure-of-merit in graphene nanoplate incorporated Cu2Se fabricated by spark plasma sintering", Journal of Alloys and Compounds, Nov. 15, 2018, vol. 769, p. 59-64.

Liu et al., "Enhanced thermoelectric performance of BiCuSeO composites with nanoinclusion of copper selenides", Journal of Alloys and Compounds, Mar. 25, 2016, vol. 662, p. 320-324.

Lognoné et al., "Reactivity, stability and thermoelectric properties of n-Bi2Te3 doped with different copper amounts", Journal of Alloys and Compounds, Oct. 15, 2014, vol. 610, p. 1-5.

* cited by examiner

2μm

500nm (a)  (b)

(a)

(b)

(a)

(b)

THERMOELECTRIC MATERIAL AND PREPARATION METHOD THEREFOR

CROSS REFERENCE TO RELATED APPLICATIONS

This application is the National Phase of PCT/KR2019/006967 filed on Jun. 11, 2019, which claims priority under 35 U.S.C. § 119(e) to U.S. Provisional Application No. 62/793,898 filed on Jan. 18, 2019, all of which are hereby expressly incorporated by reference into the present application.

FIELD

The present disclosure relates to a thermoelectric material, and more particularly, to a thermoelectric material capable of improving the figure of merit and a preparation method thereof.

BACKGROUND ART

A thermoelectric effect refers to a reversible and direct energy conversion between heat and electricity. A thermoelectric phenomenon occurs by movements of charge carriers, i.e., electrons and holes in materials.

The Seebeck effect is a conversion of temperature differences directly into electricity, and is applied to the field of power generation using an electromotive force which is generated due to a difference in temperature between two ends of a thermoelectric material. The Peltier effect is a phenomenon in which heat is generated in an upper junction and absorbed in a lower junction when a current flows in a circuit, and is applied to a cooling field using a temperature difference between both ends, caused by a current applied from the outside. On the other hand, the Seebeck effect and the Peltier effect are different from Joule heating in that such effects are thermodynamically reversible but Joule heating is not thermodynamically reversible.

In recent years, thermoelectric materials have been applied to active cooling systems for semiconductor equipment and other electronic devices in which it is difficult to solve problems regarding production of heat in passive cooling systems, and demand for such thermoelectric materials has been expanded to fields in which the problems were not solved in the systems using a conventional refrigerant gas compression method, such as precision temperature control systems applied to DNA research.

Thermoelectric cooling is an environmentally friendly cooling technique which causes neither vibration nor noise and in which no refrigerant gases causing environmental issues are used. When cooling efficiency is improved through development of highly-efficient thermoelectric cooling materials, the thermoelectric cooling materials will expand to application fields of generation cooling systems such as commercial and household refrigerators, air conditioners, and the like.

When a thermoelectric material is applied to automotive engine units, facilities from which heat is released in industrial factories, etc., electricity may be generated due to a difference in temperature caused between both ends of the thermoelectric material. As a result, the thermoelectric material has drawn attention as one new and renewable energy source.

DISCLOSURE

Technical Problem

The present disclosure has been proposed for satisfying those needs, and is directed to providing a thermoelectric material capable of improving thermoelectric performance, and a preparation method thereof.

Specifically, an aspect of the present disclosure is to provide a thermoelectric material that exists in the form (nano inclusion) that nanoparticles are dispersed in a matrix compound constituting the thermoelectric material, and a preparation method thereof.

The technical problems to be solved in the present disclosure are not limited to those aspects mentioned above, and other technical problems not mentioned can be clearly understood by those skilled in the art, to which the present disclosure pertains, from the following description.

Technical Solution

As a first aspect for achieving the above object, the present disclosure provides a thermoelectric material, which may include a matrix compound having a composition of Chemical Formula 1 or Chemical Formula 2 below, and particles having a composition of Chemical Formula 3 dispersed in the matrix compound.

$$(AB_2)_x(Bi_2Se_{2.7}Te_{0.3})_{1-x}, \quad \text{<Chemical Formula 1>}$$

where A denotes a divalent cationic element, B denotes a monovalent anion element, and x satisfies $0<x\leq0.4$, $$(CB)_x(Bi_2Se_{2.7}Te_{0.3})_{1-x}, \quad \text{<Chemical Formula 2>}$$

where C denotes a monovalent cation element, B denotes a monovalent anion element, and x satisfies $0<x\leq0.4$, $$D_yE_z, \quad \text{<Chemical Formula 3>}$$

where D denotes Cu, Ag, Pd or a combination thereof, E denotes S, Se, Te, or a combination thereof, and y satisfies $0\leq y\leq 2$, or z satisfies $0\leq z\leq 1$.

Here, in Chemical Formula 1, A may be any one selected from a group consisting of Cu, Ag, and a compound thereof.

Here, in Chemical Formula 2, C may be any one selected from a group consisting of Fe, Mn, Co, Cr, V, Nb, and compounds thereof.

Here, in Chemical Formulas 1 and 2, B may be S, Se, Te, or a combination thereof.

Here, the particles may be dispersed in the matrix compound in an amount of 26 to 30% by weight of the matrix compound.

Here, the matrix compound may have a layered structure.

The layered structure may include a first layer containing Te or Se, and a second layer containing Bi.

As a second aspect for achieving the above object of the present disclosure, a method for preparing a thermoelectric material may include preparing a bulk thermoelectric material using a thermoelectric material raw material, preparing the bulk thermoelectric material into powder, adding a metal additive containing a first material made of Cu, Ag, Pd, or a combination thereof and a second material made of S, Se, Te, or a combination thereof to the powder, forming an intermediate using the powder and the metal additive, and sintering the intermediate.

Here, the bulk thermoelectric material may have a composition of Chemical Formula 4 below.

$$(CuI)_x(Bi_2Se_{2.7}Te_{0.3})_{1-x}, \quad \text{<Chemical Formula 4>}$$

where x satisfies $0<x\leq0.4$.

Here, the first material may be contained in an amount of 1 to 5% by weight of the raw material, and the second material may be contained in an amount greater than 20% to smaller than 25% by weight of the raw material.

Here, the first material may be copper (Cu).

Here, the second material may be tellurium (Te).

Here, the forming the intermediate may be performed using a melting and rapid cooling device.

In this case, the forming the intermediate may include charging the thermoelectric material powder and the metal additive into a tube having a nozzle, melting the thermoelectric material powder and the metal additive into a liquid state, and discharging the molten material to a rotating plate to form particles in a shape of a ribbon.

Here, the sintering may be performed by using spark plasma sintering.

Here, the sintering may be performed by using exclusion-sintering.

Advantageous Effects

According to an embodiment of the present disclosure, a thermoelectric material with improved thermoelectric performance can be provided.

In detail, phonons may be scattered by nanoparticles so as to reduce a thermal conductivity and a Seebeck coefficient may be increased by a carrier filtering effect by the nanoparticles to thus improve the thermoelectric performance.

In particular, in the case of preparing a bulk thermoelectric material using extrusion-sintering, a crystal orientation direction and a usage direction of the material may be the same, so that an electrical conductivity can be increased to improve the thermoelectric performance, which may provide an advantageous effect in terms of cost and production.

The effects obtained by the present disclosure are not limited to the effects mentioned above, and other effects not mentioned can be clearly understood by those skilled in the art from the following description.

MODES FOR CARRYING OUT THE PREFERRED IMPLEMENTATIONS

A composition of a thermoelectric material used around room temperature (300K) for cooling or heat pumps is generally represented by $(Bi_aSb_{1-a})_2(Te_cSe_{1-c})_3$, and a figure of merit (ZT) of a polycrystalline bulk material is about 1 at 300K. Performance of the thermoelectric material may be determined by a figure of merit (ZT) value as defined by Equation 1, which is generally referred to as a dimensionless figure of merit.

$$ZT = \frac{S^2 \sigma T}{k} \qquad [\text{Equation 1}]$$

In Equation 1, S denotes a Seebeck coefficient (meaning thermoelectric power generated due to a temperature difference per 1° C.), σ denotes an electrical conductivity, T denotes an absolute temperature, and κ denotes a thermal conductivity. $S^2\sigma$ constitutes a power factor. As shown in Equation 1 above, in order to increase the figure of merit (ZT) of the thermoelectric material, the Seebeck coefficient S and the electrical conductivity σ, that is, the power factor $S^2\sigma$, should be increased and the thermal conductivity κ should be decreased.

However, the Seebeck coefficient and the electrical conductivity have a trade-off relationship with each other. Thus, one value increases when the other value decreases and vice versa depending on a change in concentration of electrons or holes as carriers. For example, a metal having high electrical conductivity has a low Seebeck coefficient, and an insulating material having a low electrical conductivity has a high Seebeck coefficient. The trade-off relationship between the Seebeck coefficient and the electrical conductivity restricts an increase in power factor.

Figure 1A:
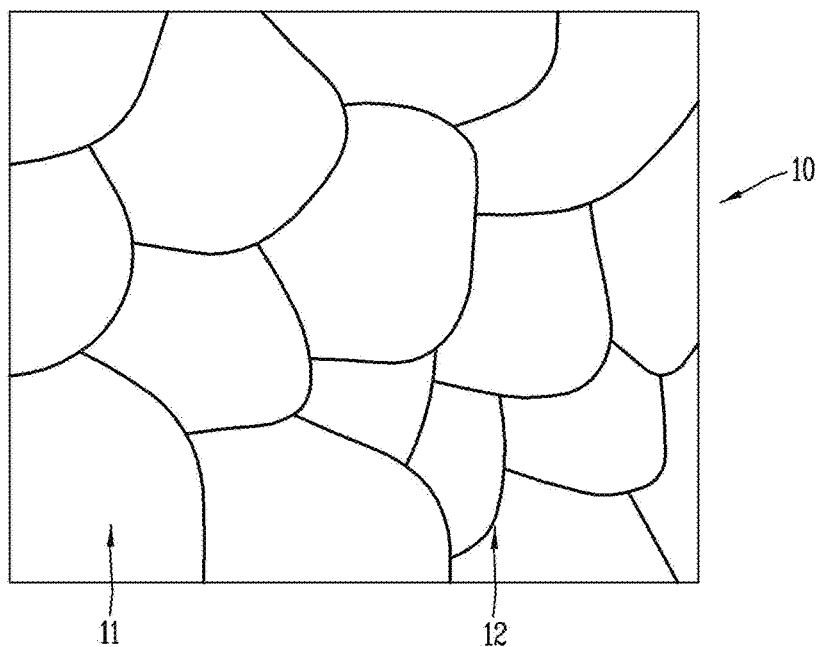
FIGS. 1A to 1C are diagrams illustrating microstructures of thermoelectric materials for improving figures of merit ZT of the thermoelectric materials.
Figure 1B:
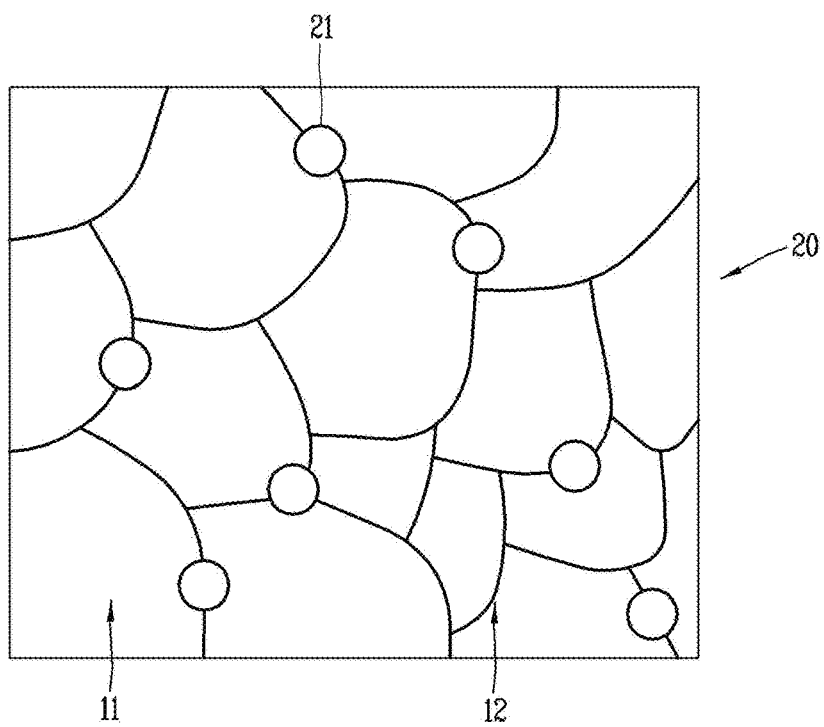
Figure 1C:
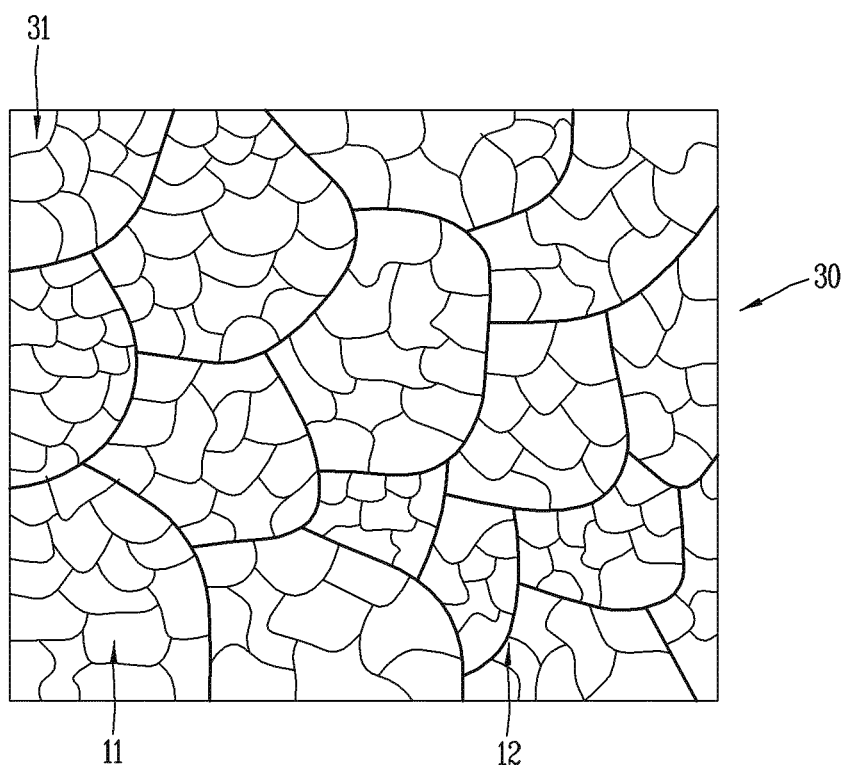

FIGS. 1A to 1C are views illustrating microstructures of thermoelectric materials applied to the present disclosure for improving figures of merit (ZT) of the thermoelectric materials.

In order to improve the figures of merit (ZT) of thermoelectric materials, there have been attempts to form nanostructures such as superlattice thin films, nanowires, and quantum dots, and the like to increase the Seebeck coefficient using a quantum confinement effect or decrease the thermal conductivity based on a Phonon Glass Electron Crystal (PGEC) concept.

First, the quantum confinement effect is a concept in which an increase in energy density of states (DOS) of carriers in a material is caused by nanostructures to increase an effective mass, resulting in increasing the Seebeck coefficient. In this case, an interrelation between the electrical conductivity and the Seebeck coefficient collapses, and thus the electrical conductivity does not significantly increase even when the Seebeck coefficient increases.

Second, the PGEC concept is a concept in which only the thermal conductivity is lowered without any decrease in electrical conductivity by blocking movements of phonons taking part in heat transfer and preventing movements of charge carrier electrons from being blocked. That is, among the phonons and the charge carrier electrons that transfer heat from a high-temperature side to low-temperature side of the thermoelectric material, only movement of the phonons is blocked by a barrier (phonon scattering), and the charge carrier electrons flows smoothly. Therefore, such a concept has an effect of lowering thermal conductivity due to phonon scattering, but has an effect of preventing electrical conductivity from being lowered due to the charge carrier electrons.

These techniques will be described in detail with reference to drawings of a microstructure of the thermoelectric material.

FIG. 1A is a diagram illustrating a microstructure of a nanocomposite thermoelectric material 10. In the nanocomposite thermoelectric material 10, a ZT value may be increased by reducing a size of a grain 11 of the thermoelectric material. The grain 11 may have a diameter of 20 to 100 nanometers (nm).

When the phonons pass through a grain boundary 12, the phonon scattering phenomenon may occur. Accordingly, thermal conductivity may be lowered with a decrease in size of the grain 11. On the other hand, since the movements of the charge carrier electrons are affected at a relatively low level when the phonons pass through the grain boundary 12, a change in electrical conductivity may be minimized. Therefore, as shown in FIG. 1A, the thermoelectric material having the nanocomposite structure can obtain the ZT value which is increased due to the PGEC concept.

FIG. 1B is a diagram illustrating a microstructure of an eluted thermoelectric material 20 having an increased ZT value through elution of a predetermined material 21 onto the grain boundary 12.

The material 21 eluted onto the grain boundary 12 may cause phonon scattering and simultaneously have an effect of improving electrical conductivity, thereby increasing the total ZT value of the eluted thermoelectric material 20.

FIG. 1C is a diagram illustrating a microstructure of a thermoelectric material 30 having a hierarchical structure obtained through a change in process.

The hierarchical structure serves to form another grain in the grain 11, and thus induces phonon scattering of larger phonons through the larger grain 11 and induced phonon scattering of smaller phonons through the smaller grain 31. Thermal conductivity of the thermoelectric material can be lowered by the thusly-induced phonon scattering.

According to the microstructures as described above, a structure for lowering the thermal conductivity is commonly brought into focus. As such, a method of changing only thermal conductivity to change the ZT value has a drawback in that a change in the ZT value may be merely slight.

As still another specific method to realize the PGEC concept, ZT is very significantly improved when a PbSeTe layer is formed on PbTe in a superlattice or $Bi_2Te_3$ and $Sb_2Te_3$ layers are stacked into a superlattice. However, a thin film process should be artificially used to form such a superlattice. This requires so expensive facilities. And, the thermoelectric materials are not suitable for actual use for thermoelectric power generation and cooling devices since the thin films have a thickness of several hundreds of nanometers even when the thin films are formed to a large thickness.

Therefore, a structure capable of improving electric conductivity and Seebeck coefficient as well as reducing thermal conductivity by means of nanostructures is proposed as the microstructure of the thermoelectric material proposed in one embodiment of the present disclosure.

One of major strategies for lowering thermal conductivity is to realize a microstructure capable of effectively scattering phonons taking part in heat transfer through nano-structurization, which may be the same as described with reference to FIG. 1A. The grain boundary 12 is an effective interface for phonon scattering. Therefore, a lattice thermal conductivity may be lowered when a particle size is reduced to increase a density of the grain boundary 12. Recently, a technique of preparing nano-sized thermoelectric material particles such as nanoparticles, nanowires, nanoplates, and the like has come to the fore as a strategy for developing such materials.

On the other hand, since the electrical conductivity and the Seebeck coefficient have the trade-off relationship as described above, it is difficult to improve both values at once. The trade-off relationship between the Seebeck coefficient and the electrical conductivity appears since it is difficult to simultaneously adjust physical properties such as Seebeck coefficient and electrical conductivity in a bulk sample. However, it is possible to break the trade-off relationship between the Seebeck coefficient and the electrical conductivity when a channel for realizing the Seebeck coefficient and the electrical conductivity may be divided into two channels. That is, the high Seebeck coefficient and electrical conductivity may be realized at the same time when the electrical conductivity is obtained from a sample surface and the Seebeck coefficient is given as a high value from a bulk material.

In one embodiment of the present disclosure, a topological insulator (hereinafter, referred to as "TI") may be used in order to realize high Seebeck coefficient and electrical conductivity at the same time.

The topological insulator refers to a material in which a bulk behaves as an insulator due to strong spin-orbital bonding and time reversal symmetry but a surface is a topologically protected metal. That is, it means that electrons can only move through the surface of the sample, and this phenomenon in which the sample surface of the insulator is metallic is referred to as a "Topological metallic state." Electrical conductivity of the thermoelectric material may be improved when the electrons move through a metal layer formed on the surface of the topological insulator. Hereinafter, a microstructure of a thermoelectric material in accordance with one embodiment of the present disclosure will be described in detail.

Figure 2:
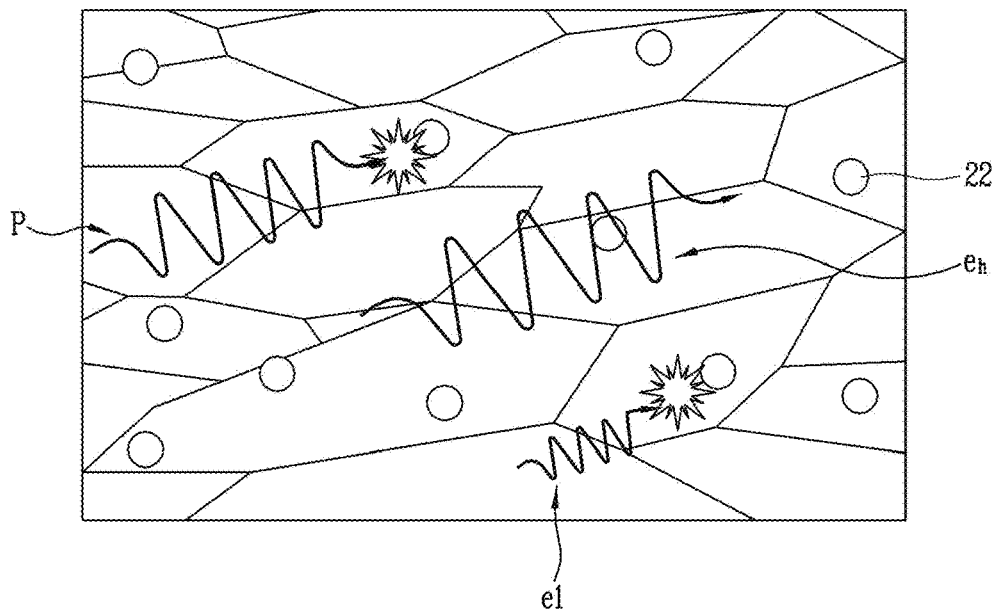
FIG. 2 is a schematic view illustrating a microstructure of a thermoelectric material in accordance with one embodiment.

FIG. 2 is a schematic view illustrating a microstructure of a thermoelectric material in accordance with one embodiment.

Referring to FIG. 2, a matrix compound (matrix material) having a composition of Chemical Formula 1 or Chemical Formula 2 below forms a microstructure, and particles 22 are present in a dispersed state in this microstructure.

  [Chemical Formula 1]

Here, A denotes a divalent cationic element, B denotes a monovalent anion element, and x may satisfy a condition of $0 < x \leq 0.4$.

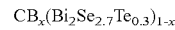  [Chemical Formula 2]

Here, C denotes a monovalent cationic element, B denotes a monovalent anion element, and x may satisfy a condition of 0<x≤0.4.

In addition, the particles 22 may have a size of a nanometer scale, hereinafter, will be referred to as nanoparticles.

As such, the thermoelectric material exists in a state in which the nanoparticles 22 are dispersed in the matrix compound having the composition of Chemical Formula 1 or Chemical Formula 2. Here, the nanoparticles 22 may have a composition of Chemical Formula 3 below.

  [Chemical Formula 3]

Here, D may be Cu, Ag, Pd or a combination thereof, and E may be S, Se, Te, or a combination thereof. Also, y satisfies 0≤y≤2 or z satisfies 0≤z≤1.

In this case, in Chemical Formula 1, A may be any one selected from a group consisting of Cu, Ag, and a compound thereof.

Here, in Chemical Formula 2, C may be any one selected from a group consisting of Fe, Mn, Co, Cr, V, Nb, and compounds thereof.

In addition, in Chemical Formulas 1 and 2, B may be S, Se, Te, or a combination thereof.

Meanwhile, the nanoparticles 22 may be dispersed in the matrix compound in an amount of 26 to 30% by weight of the matrix compound.

As a detailed example, the nanoparticles 22 may be $Cu_2Te$. Here, the copper (Cu) may be present in an amount of 1 to 5% by weight of the matrix compound and the tellurium (Te) may be present in an amount of 20 to 25% by weight of the matrix compound.

The thermoelectric material according to the one embodiment of the present disclosure may be an n-type thermoelectric semiconductor. That is, the thermoelectric semiconductor may be a semiconductor in which electrons act as majority carriers.

At this time, phonons P are scattered by the nanoparticles 22 existing in the dispersed state in the matrix compound so as to reduce the thermal conductivity, and the Seebeck coefficient is increased by a carrier filtering effect caused by the nanoparticles 22, thereby improving thermoelectric performance.

In addition, high-energy electrons eh may pass through the nanoparticles 22 but low-energy electrons ei may be scattered with the nanoparticles 22.

As such, doped CuI is distributed in a state of $Cu^+$ and $I^-$ in a unit cell to generate an electric field, thereby improving electrical conductivity.

In addition, since the nanoparticles (Nano inclusion) 22 have a Te-based composition which is the same as that of the matrix compound, it is possible to reduce the decrease in thermoelectric properties of the thermoelectric material and to elute the nanoparticles in a more uniform size.

As such, the nanoparticles 22 can selectively reduce the thermal conductivity by the phonon scattering so as to contribute to the improvement of the ZT value.

Figure 3:
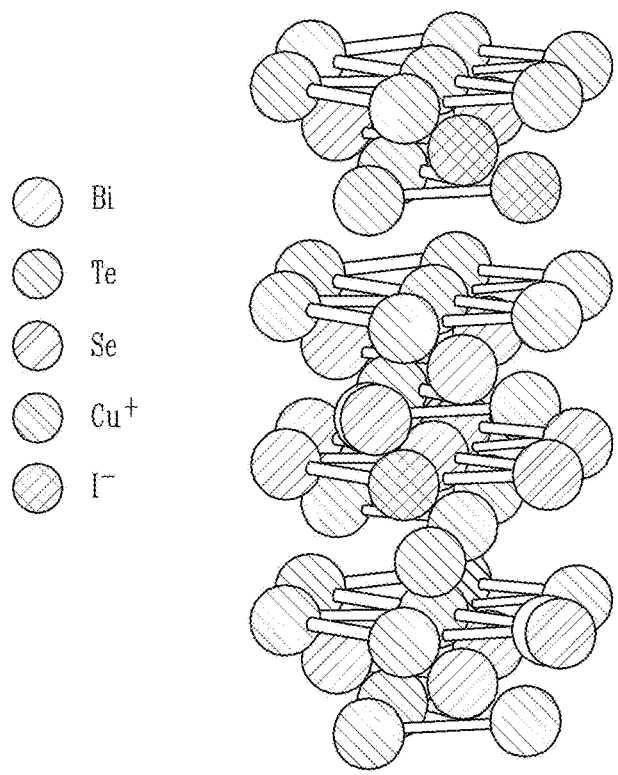
FIG. 3 is a schematic view illustrating an atomic bonding structure of a thermoelectric material in accordance with one embodiment.
Figure 4:
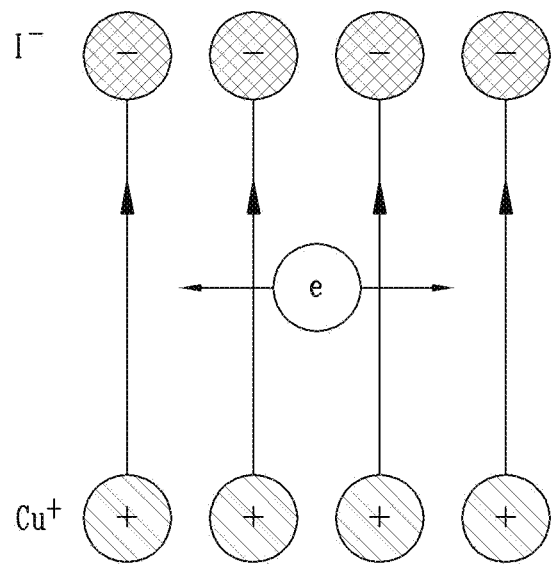
FIG. 4 is a schematic view illustrating an electric field generation by an ionic bond of a thermoelectric material in accordance with one embodiment.

FIG. 3 is a schematic view illustrating an atomic bonding structure of a thermoelectric material in accordance with one embodiment, and FIG. 4 is a schematic view illustrating an electric field generation by an ionic bond of a thermoelectric material in accordance with one embodiment.

The Bi—Se—Te-based compound according to Chemical Formula 1 or 2 may have a layered structure including layers each having a planar structure as shown in FIG. 3. That is, the compound may have a layered structure including a plurality of layers.

The planar structure may include any one selected from a group consisting of Te, Se, Bi, and compounds thereof.

In addition, the layered structure may include at least one first layer including a Te or Se element and at least one second layer including Bi.

A bond between the first layers may be an ionic bond and a van der Waals bond.

For example, when an A(Cu) or C element is inserted between the first layers and a B(I) element is partially substituted at a Te or Se position of the first layer, the A (or C) cation element and the B anion element may form the ionic bond.

That is, in the compound represented by Chemical Formula 1 or 2, in-plane elements form a covalent bond so as to have a strong bonding force, and an interlayer bond between out-of-plane elements is at least one of the ionic bond and the van der Waals bond so as to have a weak bonding force.

An electric field as shown in FIG. 4 may be formed by the ionic bond.

An ionic compound may be doped into $Bi_2Se_{2.7}Te_{0.3}$, namely, the matrix compound, to form an ionic crystal field inside the Bi—Se—Te-based compound. The ionic crystal field can thusly enhance electron mobility. Accordingly, current density can be improved, thereby increasing the electrical conductivity.

Figure 5:
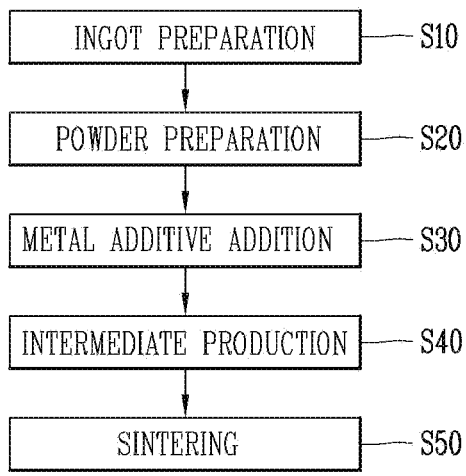
FIG. 5 is a flowchart illustrating a method for manufacturing a thermoelectric material in accordance with one embodiment.

FIG. 5 is a flowchart illustrating a method for preparing a thermoelectric material in accordance with one embodiment.

Hereinafter, a method for preparing a thermoelectric material according to one embodiment of the present disclosure will be described in detail with reference to FIG. 5.

In order to prepare the aforementioned thermoelectric material, first, a bulk thermoelectric material (e.g., ingot) is prepared using thermoelectric material raw materials (S10). In this case, the raw materials may include Cu, I, Bi, Sb, and Te.

First, the raw materials are weighted at molar ratios according to the composition of the bulk thermoelectric material. The raw materials are then charged into a quartz tube and sealed in a vacuum state.

After that, the raw materials are charged into a melting furnace and melted at a high temperature of about 1,000° C., followed by being cooled down to room temperature to prepare an ingot.

The prepared bulk thermoelectric material (ingot) is pulverized to be prepared in a powder form (S20). For example, the ingot may be made into a powder form by a ball milling process.

A predetermined amount of metal additive is added to the material (S30). The metal additive may be a material represented by Chemical Formula 3 described above.

In the state in which the powder and the metal additive are mixed with each other, an intermediate is produced by using a melting and rapid cooling device (S40). This intermediate may be a material in the form of a ribbon. The intermediate may form metal additive nanoparticles which are dispersed in the thermoelectric material (the matrix compound).

In a rapid cooling process, the material is charged into a quartz tube having a narrow nozzle size, melted by induction heating, and then instantaneously discharged to a copper rotating plate, which is rotating at high speed, by applying gas pressure, to be cooled and solidified, thereby producing particles in the form of the ribbon.

That is, the process of producing the intermediate may include processes of charging the thermoelectric material powder and the metal additive into a tube having a nozzle, melting the thermoelectric material powder and the metal additive into a liquid state, and producing ribbon-shaped particles by discharging the molten material to a rotating plate.

Thereafter, this intermediate is sintered to prepare a thermoelectric material (S50). According to an embodiment of the present disclosure, the sintering of the intermediate may be carried out by selectively applying spark plasma sintering (SPS) or extrusion-sintering.

Figure 14:
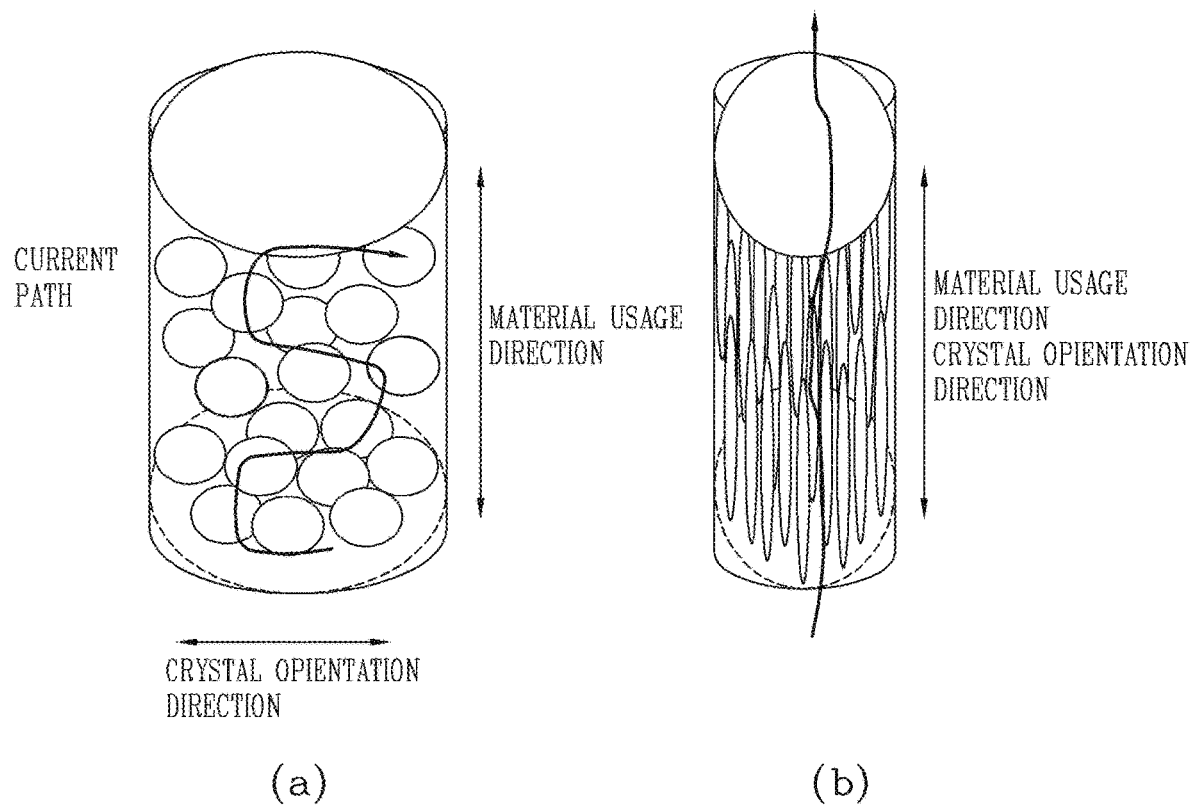
FIG. 14 is a diagram illustrating crystal orientation directions of thermoelectric materials prepared through respective sintering methods in accordance with an embodiment.
Figure 15:
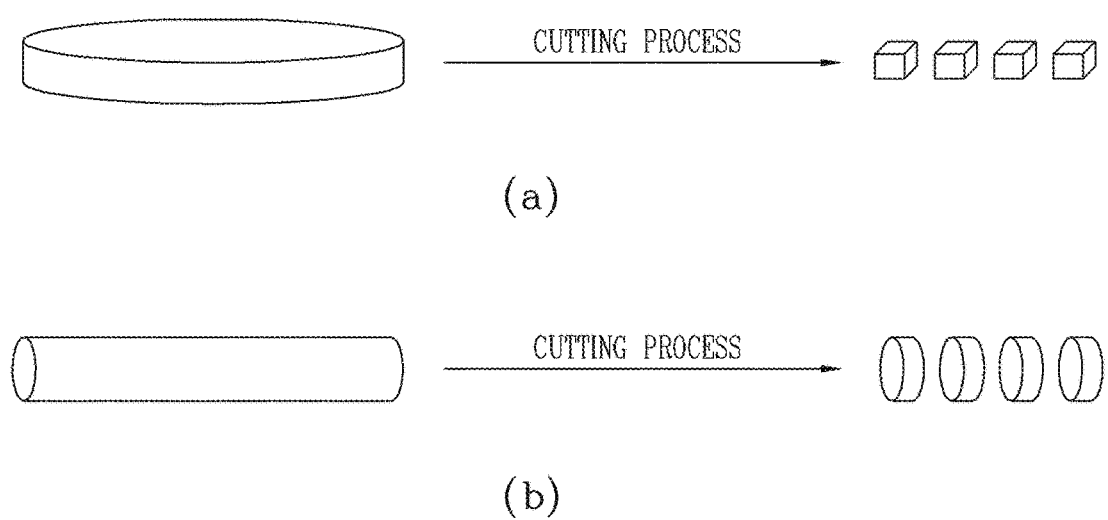
FIG. 15 is a diagram illustrating shapes of sintered bodies prepared through respective sintering steps and shapes of materials after respective cutting steps, in accordance with an embodiment.

FIG. 14 is a diagram illustrating crystal orientation directions of thermoelectric materials prepared by respective sintering methods in accordance with an embodiment, and FIG. 15 is a diagram illustrating shapes of sintered bodies prepared through respective sintering steps and shapes of materials after respective cutting steps, in accordance with an embodiment. Specifically, (a) of FIG. 14 and (a) of FIG. 15 illustrate a case by the spark plasma sintering, and (b) of FIG. 14 and (b) of FIG. 15 illustrate a case by the extrusion-sintering.

In one embodiment, the material in the form of the ribbon may be prepared as a bulk-type thermoelectric material by the spark plasma sintering using a carbon mold. In this case, a spark plasma apparatus may be used.

Specifically, in the case of the spark plasma sintering, the ribbon-shaped material is charged into the carbon mold as it is or after being powdered. Afterwards, when a DC current is applied while pressing the charged material, plasma in the form of spark is generated between powder particles constituting the material. At this time, sintering is carried out to instantaneously heat the material to a high temperature and connect the powder particles together.

In another embodiment, the ribbon-shaped material may be prepared as a bulk-type thermoelectric material by the extrusion-sintering.

Specifically, the extrusion-sintering is performed in a manner of putting the ribbon-shaped material (or powder) into a piston and then pressing the piston so that the material passes through a nozzle provided on one side of the piston. The material may be heated at a predetermined temperature for a predetermined time during an extrusion process. Accordingly, a bulk-type thermoelectric material may be prepared.

In this case, an extrusion ratio in the sintering step may preferably be set to at least 5 for uniformity and refinement of the thermoelectric material particles, and the sintering may be performed under a pressure condition of 5 to MPa. In addition, it may be carried out under a temperature condition of 300° C. to 600° C. The sintering step by the extrusion-sintering may be performed for several seconds to several tens of minutes under such pressure and temperature conditions. However, the pressure condition may slightly vary depending on a structure of process equipment or the like.

In general, thermoelectric materials made in a polycrystalline form are prepared by producing an ingot, and preparing the ingot into powders having a size of several to several tens of microns by a ball milling process, followed by a hot-pressing process. However, since a cooling rate is slow when using this general process, there is a limit to reducing a grain size of a bulk material. This may cause electrical conductivity and thermal conductivity to be simultaneously increased, thereby having a limit to increasing thermoelastic performance.

On the other hand, in the case of the extrusion-sintering, it is carried out by a small-area continuous process. This process is advantageous in terms of the number of cuts, compared to the spark plasma sintering, in the step of cutting a sintered body, and accordingly, may enhance mass productivity of product by reducing a tack time. In addition, as shown in FIG. 15, it is possible to minimize a portion wasted when cutting the sintered body, so there is an advantage in terms of cost reduction of the material.

Hereinafter, detailed embodiments of the present disclosure will be described in detail.

1. Production of Ingot

Cu, I, Bi, Sb, and Te are quantitatively measured at molar ratios according to a composition ratio of $(CuI)_x(Bi_2Se_{2.7}Te_{0.3})_{1-x}$ (where x=0.003) and charged into a quartz tube.

At this time, the quartz tube is sealed at a degree of vacuum of $10^{-5}$ torr.

In this way, the vacuum-sealed quartz tube is put into an electric furnace, gradually heated up to 1,050° C., maintained at 1,050° C. for 12 hours, and then cooled to prepare an ingot.

2. Preparation of Bulk Thermoelectric Material

Figure 6:
FIG. 6 is an Electron Backscattering Diffraction (EBSD) image of an intermediate in accordance with one embodiment.
Figure 7:
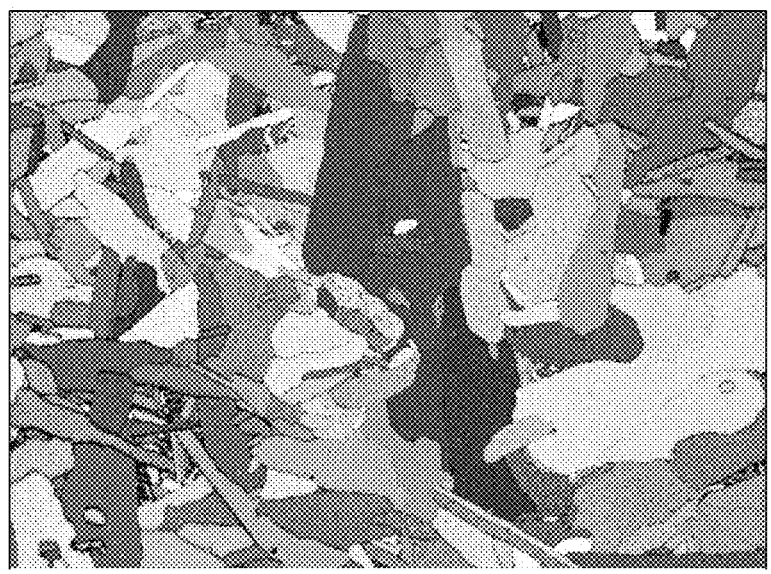
FIG. 7 is an EBSD image of BiSeTe for comparison with the present disclosure.

FIG. 6 is an Electron Backscattering Diffraction (EBSD) image of intermediates in accordance with one embodiment. Also, FIG. 7 is an EBSD image of BiSeTe for comparison with the present disclosure.

The ingot material produced with the composition ratio of $(CuI)_x(Bi_2Se_{27}Te_{0.3})_{1-x}$ (where x=0.003) is produced into powder having a size of several to several tens of microns through a milling process.

Then, for producing nanoparticles (e.g., $Cu_2Te$), 20 to 25% by weight of tellurium (Te) and 1 to 5% by weight of copper (Cu) powder as a metal additive are mixed with the matrix composition powder, to produce an intermediate using a rapid cooling device.

That is, in order to produce the intermediate in the form of a ribbon using the rapid cooling device, the mixture is made into pellets with a diameter of to 15 mm and a height of 10 mm or more, and then put into a quartz tube having a nozzle size of about 0.3 to 0.4 mm in diameter.

Thereafter, the powder is melted by induction heating and then cooled and solidified by discharging it to a copper rotating plate, which has a diameter of 300 mm and rotates at high speed, by applying pressure, thereby producing an intermediate in the form of the ribbon in which the metal additive is eluted. That is, the metal additive may be distributed in the form of nanoparticles.

At this time, when the rotating plate rotates at 2800 to 3200 rpm, a ribbon-shaped material having a thickness of about 1 μm to 100 μm is obtained. The ribbon-shaped material forms the metal additive nanoparticles and is dispersed in the thermoelectric material. The thermoelectric material and the metal additive may then be formed to have sizes in the range of several tens to several hundreds of nanometers nm by virtue of the effect of the rapid cooling.

For example, a material with $(CuI)_x(Bi_2Se_{2.7}Te_{0.3})_{1-x}$ which is the thermoelectric matrix, and Cu/Te as the metal additive may be mixed to produce the material in the form of the ribbon using the rapid cooling device.

Thereafter, the ribbon-shaped intermediate which was made through the rapid solidification using the rapid cooling device is pulverized, and then subjected to press-sintering using the spark plasma sintering or the extrusion-sintering.

In this case, when the spark plasma sintering is used, the ribbon-shaped intermediate may have a surface in a shape as illustrated in FIGS. 6 and 7.

That is, according to a result of comparison between an EBSD image of the surface of the thermoelectric material prepared by the present disclosure (FIG. 6) and an EBSD image of the sample produced by preparing the powder with the composition ratio of $Bi_2Se_{2.7}Te_{0.3}$ through the ball milling process and sintering the powder by the spark plasma sintering (FIG. 7), it can be confirmed that an average grain size is reduced from about 24 microns to about 9 microns.

Figure 8:
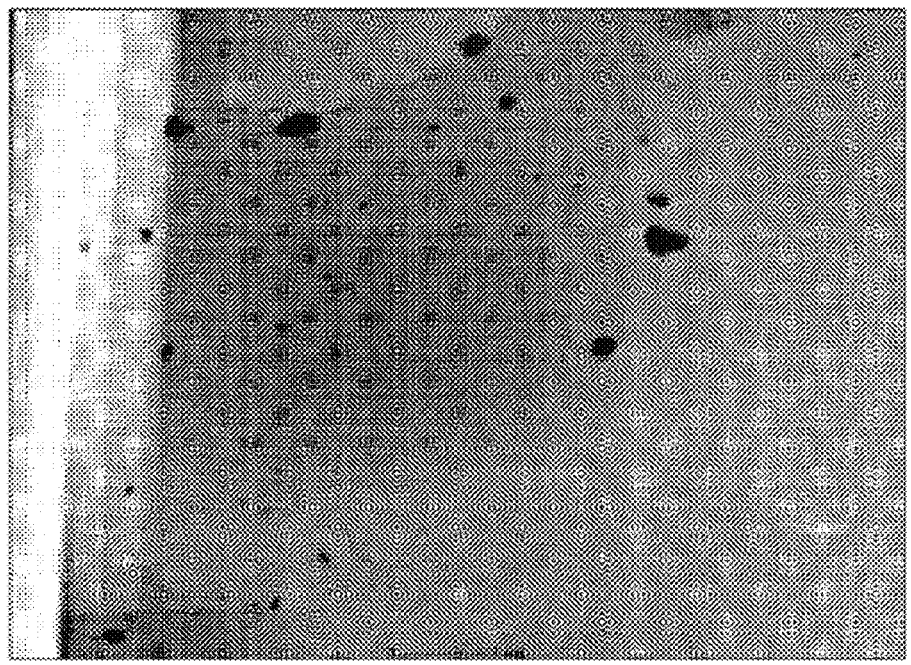
FIG. 8 is a high-resolution Transmission Electron Microscopic (TEM) image of a thermoelectric material prepared by sintering, in accordance with one embodiment.
Figure 9:
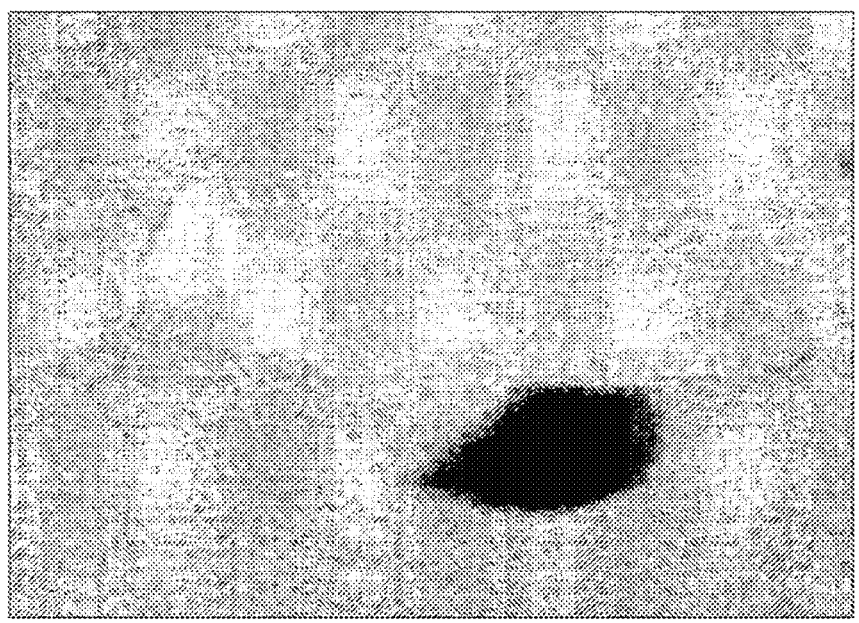
FIG. 9 is an enlarged view of a part A in FIG. 8.
Figure 10:
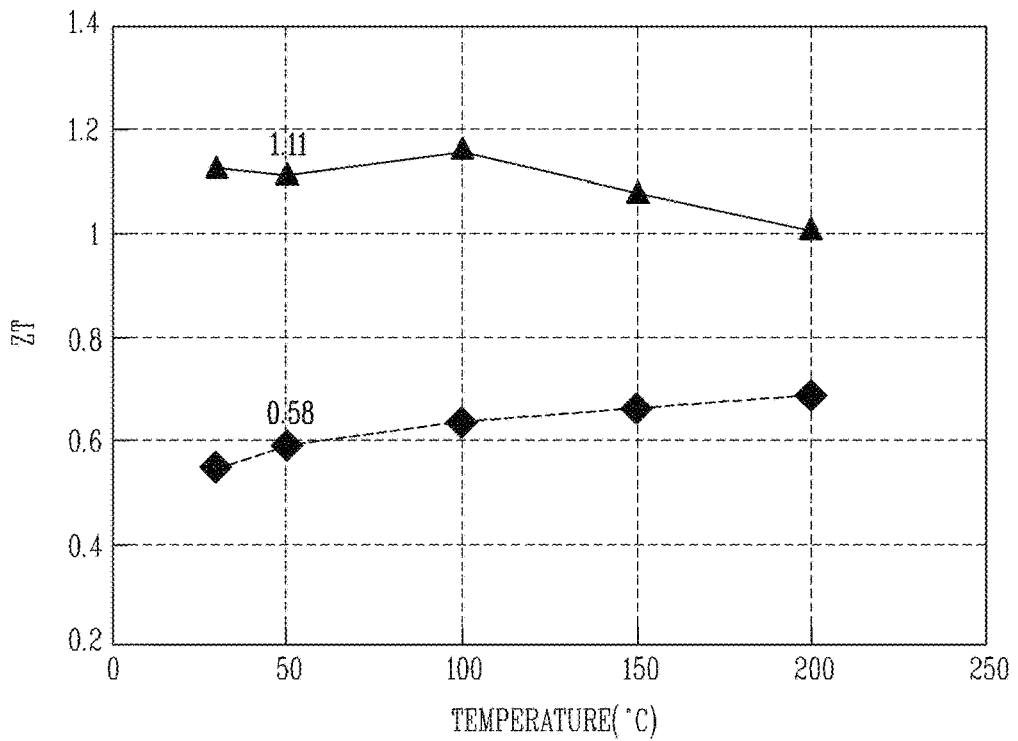
FIGS. 10 to 13 are graphs showing characteristics for temperatures of a thermoelectric material prepared according to an embodiment of the present disclosure.
Figure 11:
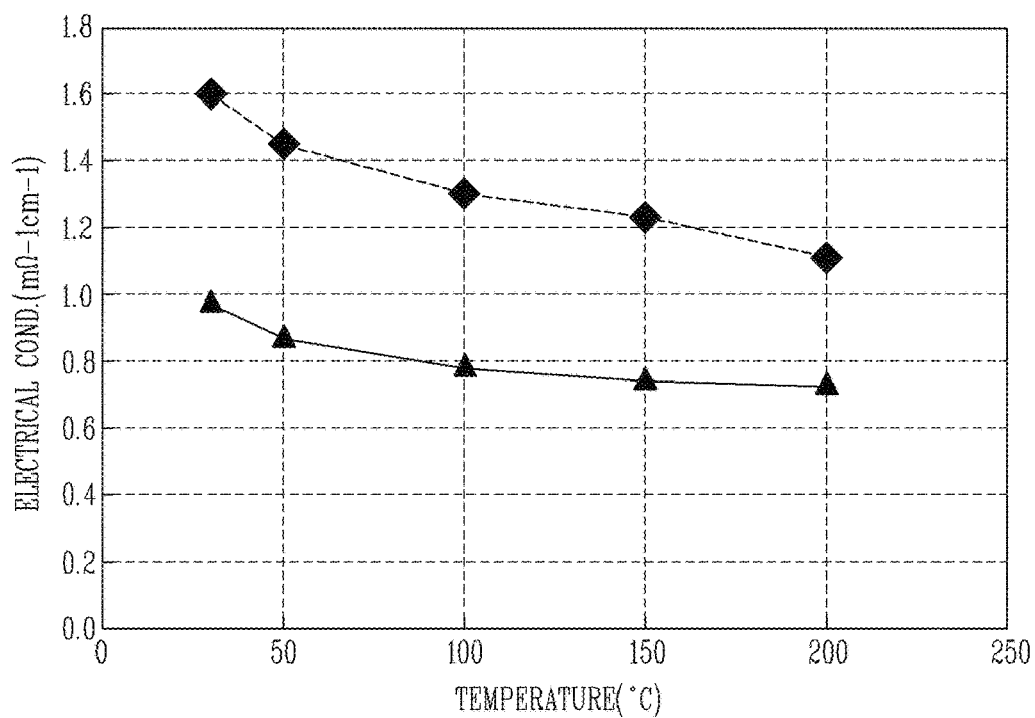
Figure 12:
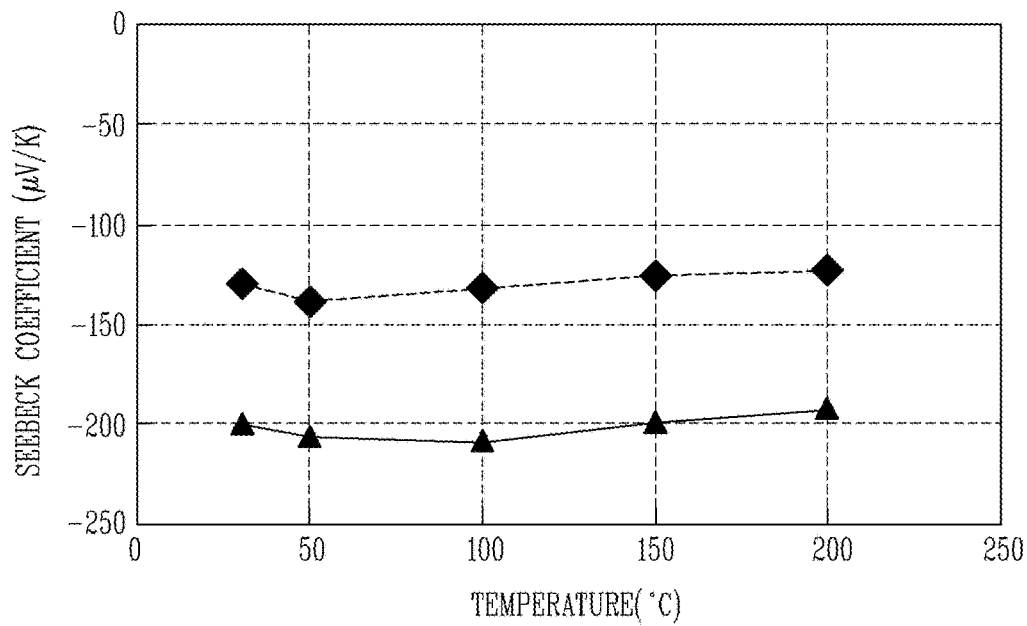

FIG. 8 is a high-resolution Transmission Electron Microscopic (TEM) image of a thermoelectric material prepared by sintering in accordance with one embodiment. Also, FIG. 9 is an enlarged view of a part A in FIG. 8.

As such, it can be confirmed based on the TEM image that $Cu_2Te$ particles (part B) having a size of several tens to several hundreds of nanometers are formed on the thermoelectric material matrix.

3. Characteristic Evaluation Results

FIGS. 10 to 13 are graphs showing characteristics for temperatures of a thermoelectric material prepared according to an embodiment of the present disclosure.

Specifically, FIGS. 10 to 13 compare characteristic values (denoted by dotted lines and squares) of the sample prepared by using $Bi_{0.5}Sb_{1.5}Te_3$ with a stoichiometric composition according to the related art with characteristic values (denoted by solid lines and triangles) of the thermoelectric material prepared according to the embodiment of the present disclosure.

Electrical conductivity and Seebeck coefficient were simultaneously measured using ULVAC ZEM-3, and thermal conductivity was calculated from thermal diffusivity measured by ULVAC TC-9000H (Laser Flash method).

Examining the thermoelectric figure of merit (ZT) and each characteristic value calculated from those results, it can be seen that the electrical conductivity decreased from 1.45 to 0.88 but the Seebeck coefficient increased from 139 to 205 when a reference temperature was 50° C.

Meanwhile, it can also be seen that the thermal conductivity decreased from 1.39 to 1.07 and the ZT, the figure of merit of the thermoelectric material, improved from 0.58 to about 1.11.

It seems to result from that an average grain size is reduced from about 20 microns to about 9 microns, compared to the related art and the nanoparticles are formed in the grains, based on results of microstructure observation.

That is, it seems that the thermoelectric performance is improved as phonons are scattered by the nanoparticles so as to reduce the thermal conductivity and the Seebeck coefficient is increased by the carrier filtering effect by the nanoparticles.

As such, doped CuI is distributed in a state of $Cu^+$ and $I^-$ in a unit cell to generate an electric field, thereby improving electrical conductivity.

In addition, since the nanoparticles (nano inclusion) has a Te-based composition which is the same as that of the matrix compound, it is possible to mitigate the decrease in thermoelectric properties of the thermoelectric material and to elute nanoparticles in a more uniform size.

As such, the eluted nanoparticles can selectively reduce the thermal conductivity by the phonon scattering so as to contribute to the improvement of the ZT value.

Hereinafter, thermoelectric materials prepared by the spark plasma sintering and the extrusion-sintering, respectively, according to the embodiment of the present disclosure will be compared to each other with reference to FIGS. 16 and 17.

Figure 16:
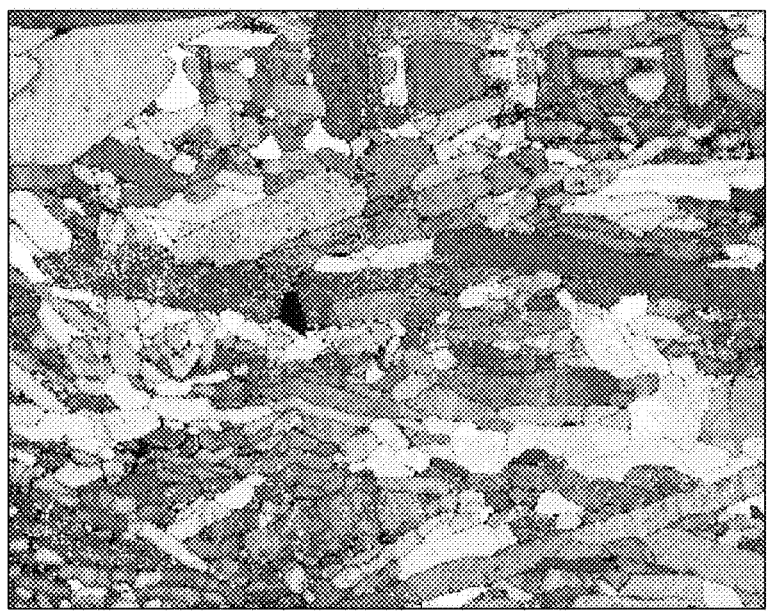
FIG. 16 is a diagram illustrating EBSD images of microstructures of thermoelectric materials prepared through respective sintering methods, in accordance with an embodiment.
Figure 16:
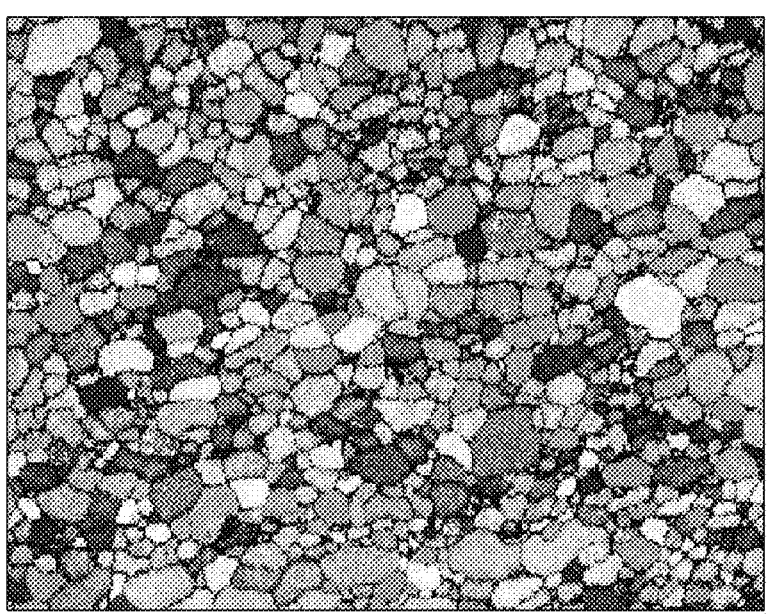
Figure 17:
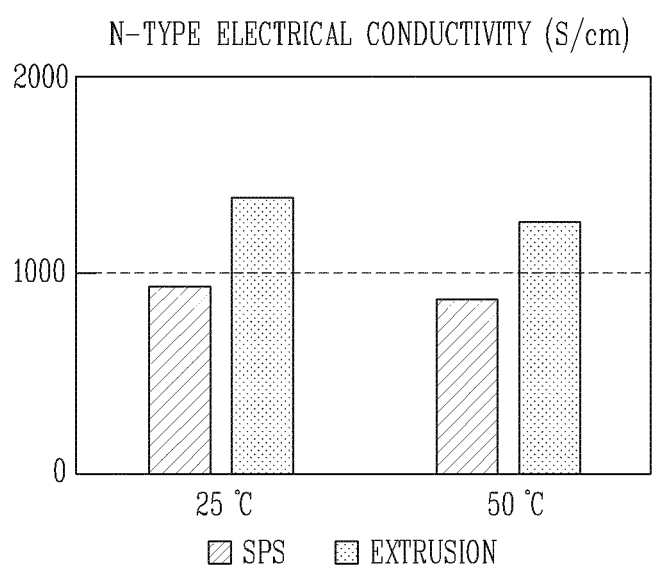
FIG. 17 is a graph showing electrical conductivity characteristics for temperatures of n-type thermoelectric materials prepared through respective sintering steps in accordance with an embodiment.

FIG. 16 is a diagram illustrating EBSD images of microstructures of thermoelectric materials prepared through respective sintering methods in accordance with an embodiment, and FIG. 17 is a graph showing electrical conductivity characteristics for temperatures of n-type thermoelectric materials prepared through respective sintering methods in accordance with an embodiment, on the temperature basis. Specifically, (a) of FIG. 16 illustrates a case by the spark plasma sintering, and (b) of FIG. 16 illustrates a case by the extrusion-sintering.

Referring to FIG. 16, it can be confirmed that the thermoelectric material prepared through the extrusion-sintering ((b) of FIG. 16), which has an average grain size of 5 to 6 microns, includes particles having finer sizes than the particles included in the thermoelectric material prepared through the spark plasma sintering, which has an average grain density of about 9 microns. That is, a thermoelectric material having a more uniform and finer structure can be prepared through the extrusion-sintering. In this case, the thermoelectric material may exhibit thermoelectric performance improved by the aforementioned carrier filtering effect and phonon scattering effect due to structural characteristics.

In addition, when employing the spark plasma sintering, a sintered area is increased which causes some limitation in uniformly dispersing nanoparticles in a matrix compound. However, when employing the extrusion-sintering, a small-area continuous process is carried out, which may provide an advantage of dispersing nanoparticles relatively uniformly in a matrix compound.

On the other hand, the thermoelectric material prepared through the extrusion-sintering showed superior electrical conductivity, compared to the thermoelectric material prepared by the spark plasma sintering at predetermined temperatures (25° C. and 50° C.) according to FIG. 17. This is because a current path is reduced which results from that a crystal orientation direction defined during the process of extruding the ribbon-shaped material through the nozzle is the same as a material usage direction considered when cutting the thermoelectric material later.

On the contrary, the thermoelectric material prepared by the spark plasma sintering exhibits improved electrical conductivity, compared to a thermoelectric material prepared by the related art hot-pressing method. In spite of this, since the crystal orientation direction of the material defined during the sintering process is different from the direction that the material is used, it affects the current path. As a result, the electrical conductivity of the thermoelectric material cannot be fully utilized. The particle crystal direction and usage direction of the material formed through each sintering process and the current path can all be confirmed in FIG. 14.

Figure 13:
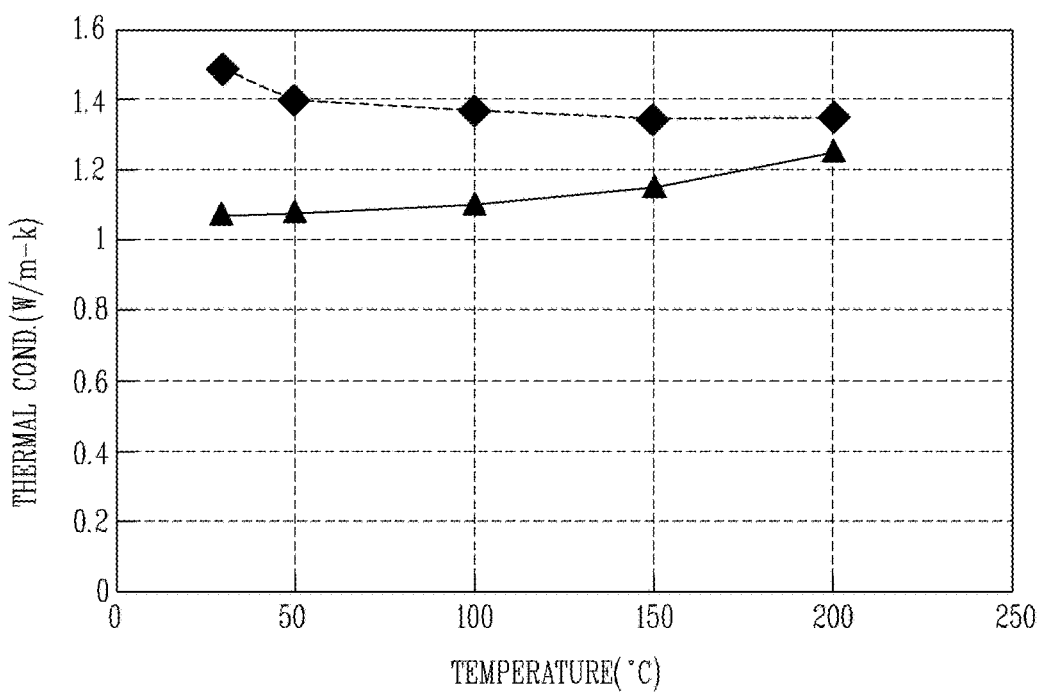

On the other hand, the graph of FIG. 13 shows only electrical conductivity measured under temperature conditions of 25° C. and 50° C., but for the aforementioned reasons, it may be obvious that the thermoelectric material prepared by the extrusion-sintering also has superior electrical conductivity, compared to the thermoelectric material prepared by the spark plasma sintering, even in other temperature conditions.

Embodiments of the present disclosure disclosed herein and accompanying drawings are merely illustrative to help understanding, and should not be construed to limit the scope of the present disclosure. It will be apparent to those skilled in the art to which the present disclosure pertains that other modifications based on the technical idea of the present disclosure can be implemented in addition to the embodiments disclosed herein.

The invention claimed is:
1. A thermoelectric material comprising:
a matrix compound having a composition of Chemical Formula 1 or Chemical Formula 2 below;

nanoparticles having a composition of Chemical Formula 3 dispersed in the matrix compound, wherein the nanoparticles have a tellurium (Te)-based composition; and grains having crystal orientation directions aligned in a same direction, where:

$(AB_2)_x(Bi_2Se_{2.7}Te_{0.3})_{1-x}$,  <Chemical Formula 1> where A is a divalent cation element, B is a monovalent anion element, and x satisfies $0<x\leq0.4$, $(CB)_x(Bi_2Se_{2.7}Te_{0.3})_{1-x}$,  <Chemical Formula 2> where C is a monovalent cation element, B is a monovalent anion element, and x satisfies $0<x\leq0.4$, and $Cu_2Te$,  <Chemical Formula 3> wherein the copper (Cu) is contained in an amount of 1 to 5% by weight of the matrix compound and the tellurium (Te) is contained in an amount of 20 to 25% by weight of the matrix compound, and wherein the nanoparticles are dispersed in the matrix compound in an amount of 26 to 30% by weight of the matrix compound and the thermoelectric material has an average grain size of 5 to 6 micron.

2. The thermoelectric material of claim 1, wherein in Chemical Formula 1, A is any one selected from a group consisting of Cu, Ag, and a compound thereof.

3. The thermoelectric material of claim 1, wherein in Chemical Formula 2, C is any one selected from a group consisting of Fe, Mn, Co, Cr, V, Nb, and compounds thereof.

4. The thermoelectric material of claim 1, wherein the matrix compound has a layered structure.

5. The thermoelectric material of claim 4, wherein the layered structure comprises:
a first layer containing Te; and
a second layer containing Bi.

6. The thermoelectric material of claim 1,
wherein the crystal orientation directions are aligned in a material usage direction of the thermoelectric material.

7. The thermoelectric material of claim 1, wherein the nanoparticles are formed from a ribbon-shaped intermediate having a thickness of about 1 μm to 100 μm.

8. The thermoelectric material of claim 1, wherein a doped CuI is distributed in a state of Cu+ and I− in a unit cell to generate an electric field in the thermoelectric material.

* * * * *